United States Patent
Yoo

(10) Patent No.: US 6,660,590 B2
(45) Date of Patent: Dec. 9, 2003

(54) VERTICAL TRANSISTOR AND METHOD OF MANUFACTURING THEREOF

(75) Inventor: Kyung Dong Yoo, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/329,570

(22) Filed: Dec. 27, 2002

(65) Prior Publication Data

US 2003/0122187 A1 Jul. 3, 2003

(30) Foreign Application Priority Data

Dec. 31, 2001 (KR) ........................................ 2001-89157

(51) Int. Cl.[7] ............................................ H01L 21/336
(52) U.S. Cl. ........................ 438/268; 438/156; 438/212; 438/269
(58) Field of Search ................................ 438/173, 197, 438/212, 206, 268, 269, 156

(56) References Cited

U.S. PATENT DOCUMENTS

| | | | | |
|---|---|---|---|---|
| 5,324,673 A | * | 6/1994 | Fitch et al. | 438/156 |
| 5,340,754 A | * | 8/1994 | Witek et al. | 438/156 |
| 6,165,823 A | * | 12/2000 | Kim et al. | 438/156 |
| 6,300,198 B1 | * | 10/2001 | Aeugle et al. | 438/268 |
| 6,426,259 B1 | * | 7/2002 | Yu | 438/269 |
| 6,440,800 B1 | * | 8/2002 | Lee et al. | 438/270 |

* cited by examiner

Primary Examiner—T. N. Quach
(74) Attorney, Agent, or Firm—Jacobson Holman PLLC

(57) ABSTRACT

The present invention discloses a vertical transistor wherein source/drain regions are formed by using a self-alignment method without using a latest photolithography, channels are formed via a selective epitaxial growth (hereinafter, referred to as 'SEG') method and gate oxide films are formed at the both ends of channels to be more efficient than devices having the same channel length, and a method of manufacturing thereof, the vertical transistor comprising: a source region formed on a semiconductor substrate; a drain region formed substantially above the source region; a vertical channel, one end of the channel being contact to the source region and the other end being contact to the drain region; and a gate electrode, formed on the substrate, surrounding the sides of the channel and the drain region, said gate electrode electrically isolated with the source region by a nitride pattern disposed therebetween, isolated with the drain region by a nitride spacer formed on the sidewalls of the drain region and isolated with channel by a gate oxide film covering the sidewalls of the channel and the exposed under surface of the drain region.

9 Claims, 7 Drawing Sheets

VERTICAL TRANSISTOR AND METHOD OF MANUFACTURING THEREOF

BACKGROUND OF THE INVENTION

1. Field of the Invention

The present invention generally relates to vertical transistors and method of manufacturing thereof, and more particularly, to a vertical transistor wherein source/drain regions are formed by using a self-alignment method without using a latest photolithography, channels are formed via a selective epitaxial growth (hereinafter, referred to as 'SEG') method and gate oxide films are formed at the both ends of channels to be more efficient than devices having the same channel length, and a method of manufacturing thereof.

2. Description of the Background Art

Although vertical devices have been proposed to overcome the limit in area of planar semiconductor devices, most of the proposed methods for manufacturing the devices are not suitable for mass production due to their complicated manufacturing process. Moreover, the methods require a photolithography and equipment thereof for forming the minimum line width. A method of forming a gate oxide film on sidewalls of a trench formed by etching a semiconductor substrate is used for vertical devices. However, in this method, the ratio of defect is high due to damage of silicon generated during the etching process, and it is difficult to perform ion-implantation process for implanting impurities because the source/drain regions are formed on the same plane as gate oxide films.

SUMMARY OF THE INVENTION

Accordingly, it is an object of the present invention to provide a vertical transistor wherein source/drain regions are formed using a self-alignment method without employing the latest photolithography, and channel regions are formed using a SEG method, and a method of manufacturing thereof, to reduce the damage and improve high integration.

In order to achieve the above-described object, there is provided a vertical transistor comprising: a source region formed on a semiconductor substrate; a drain region formed substantially above the source region; a vertical channel, one end of the channel being contact to the source region and the other end being contact to the drain region; and a gate electrode, formed on the substrate, surrounding the sides of the channel and the drain region, said gate electrode electrically isolated with the source region by a nitride pattern disposed therebetween, isolated with the drain region by a nitride spacer formed on the sidewalls of the drain region and isolated with channel by a gate oxide film covering the sidewalls of the channel and the exposed under surface of the drain region.

There is also provided a method of manufacturing a vertical transistor, comprising the steps of: (a) sequentially forming a nitride film and an oxide film on a semiconductor substrate; (b) forming an oxide film pattern by removing a predetermined portion of the oxide film to expose a portion of the nitride film; (c) forming a source region by implanting ions into the semiconductor substrate using the oxide film pattern as mask; (d) forming an oxide film spacer on the sidewalls of the oxide film pattern and selectively etching the nitride film using the oxide film spacer pattern as a mask to form a nitride film pattern exposing the substrate; (e) growing impurity-containing silicon on the exposed substrate so as to extrude over the oxide film pattern to form a first silicon layer which functions as a channel; (f) selectively growing impurity-free silicon layer on the first silicon layer to form a mushroom-shaped second silicon layer; (g) forming a drain region by implanting ions into the second silicon layer; (h) forming a nitride spacer on the sidewalls of the drain region; (i) removing the oxide film pattern and the oxide film spacer; (j) forming a gate insulating film covering the sidewalls of the first silicon layer and the exposed under surface of the drain region; (k) forming a polysilicon layer on the entire surface of the resultant structure; and (l) planarizing the polysilicon layer to expose the top portion of the drain region.

DETAILED DESCRIPTION OF THE PREFERRED EMBODIMENTS

The disclosed vertical transistor and method of manufacturing thereof will be described in more detail referring the accompanying drawings.

Figure 1:
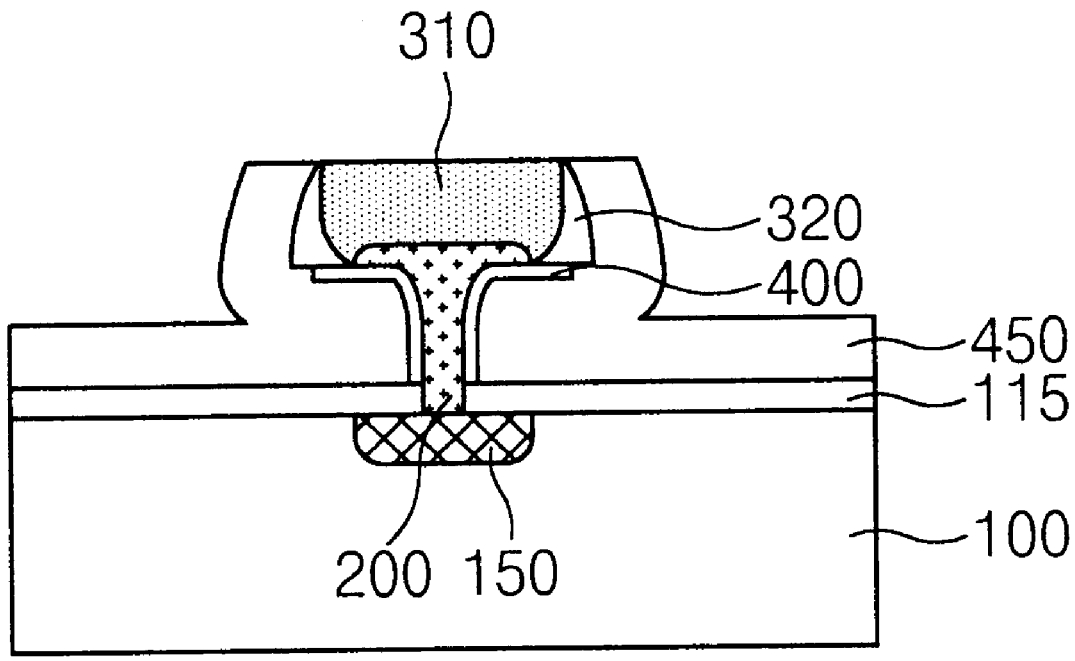
FIG. 1 is a cross-sectional diagram illustrating a vertical transistor according to the present invention.

FIG. 1 is a cross-sectional diagram illustrating a vertical transistor according to the present invention. Referring to FIG. 1, a source region 150 formed via an ion implanting process is provided in a predetermined region of a semiconductor substrate 100. A nitride film pattern 115 having an opening exposing a portion of the source region 150 is formed on the substrate 100. A first silicon layer 200 formed via a SEG method is extruded through the opening. A mushroom-shaped drain region 310 is formed on the top portion of the first silicon layer 200. Nitride film spacers 320 are formed on the sidewalls of the drain region 310. A gate oxide film 400 covers the sidewalls of the first silicon layer 200 and the exposed portion at the bottom of the drain region 310. A gate electrode 450 is formed to adjacent to the gate oxide film 400.

FIGS. 2a to 2k are cross-sectional diagrams illustrating a method of manufacturing a vertical transistor according to the present invention. Referring to FIGS. 2a to 2k, a nitride film 110 and an oxide film 120 are sequentially formed on a semiconductor substrate 100. An oxide film pattern 125 is formed by removing a portion of the oxide film 120 above where a source region 150 is to be formed, of the oxide film 120 (see FIGS. 2a and 2b) Here, the thickness of the oxide film 120, which determines the length of a channel region of a vertical transistor, preferably ranges from several to hundreds of nanometers.

Thereafter, a source region 150 is formed by implanting impurity ions into the semiconductor substrate 100 using the oxide film pattern 125 as mask. Here, it is preferable that the impurities used in ion-implantation are As, B, $BF_2$, In or Sb which are used to form conventional nMOS or pMOS. After the ion-implantation process, the additional thermal treatment process is preferably performed (see FIG. 2b).

Figure 2A:
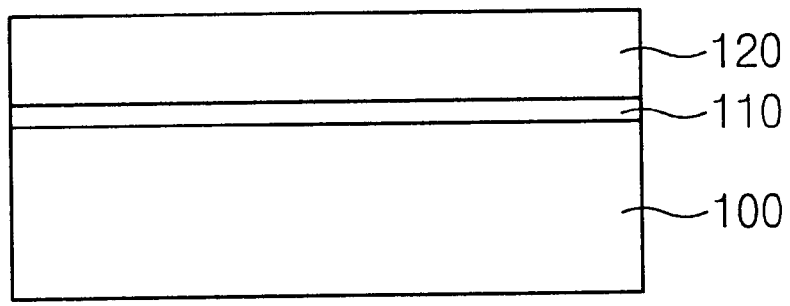
FIGS. 2a to 2k are cross-sectional diagrams illustrating a method of manufacturing a vertical transistor according to the present invention.
Figure 2B:
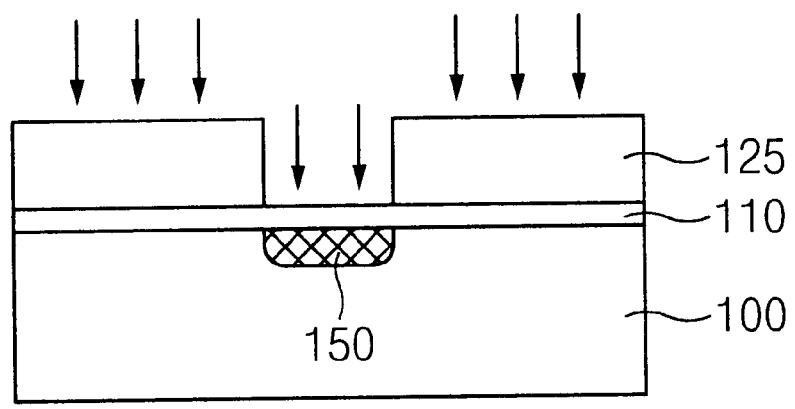
Figure 2C:
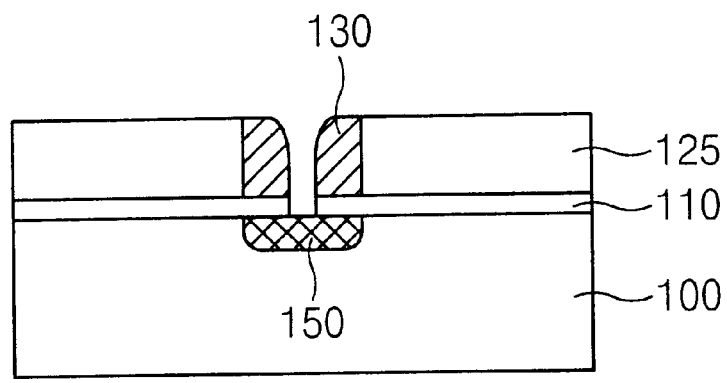

Next, an oxide film (not shown) is formed on the entire surface of the resultant structure and then etched to form oxide film spacers 130 on the sidewalls of the oxide film pattern 125 (see FIG. 2c). Here, the nitride film 110 exposed through the oxide film spacer 130 is etched to form a nitride film pattern 115 exposing the substrate 100 when the oxide film spacer is formed. Since the width of the oxide film spacer 130 determines the size of the exposed portion of the substrate 100, the width is determined considering the size of the exposed portion of the nitride film 110 exposed by the oxide film pattern 125.

Figure 2D:
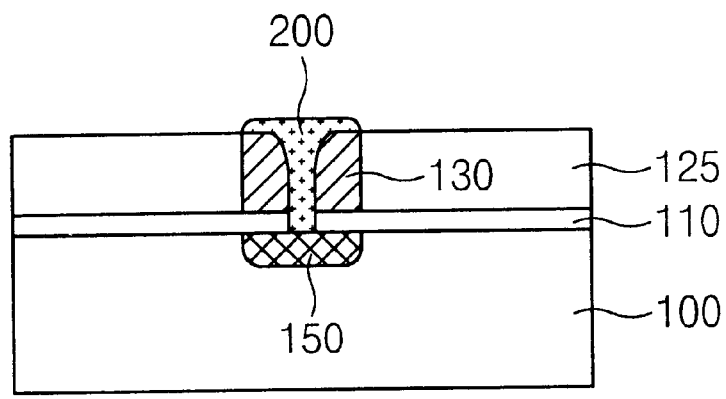

A first silicon layer 200 is formed by growing silicon having impurities on the exposed portion of the semiconductor substrate 100 via the SEG method (see FIG. 2d). The first silicon layer 200 serves as grown to extrude taller than the oxide film pattern 125. The first silicon layer 200 serves as a channel region in the vertical transistor according to the present invention.

Figure 2E:
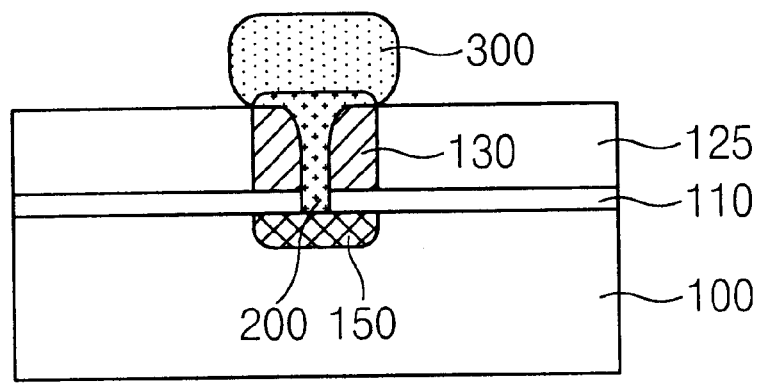
Figure 2F:
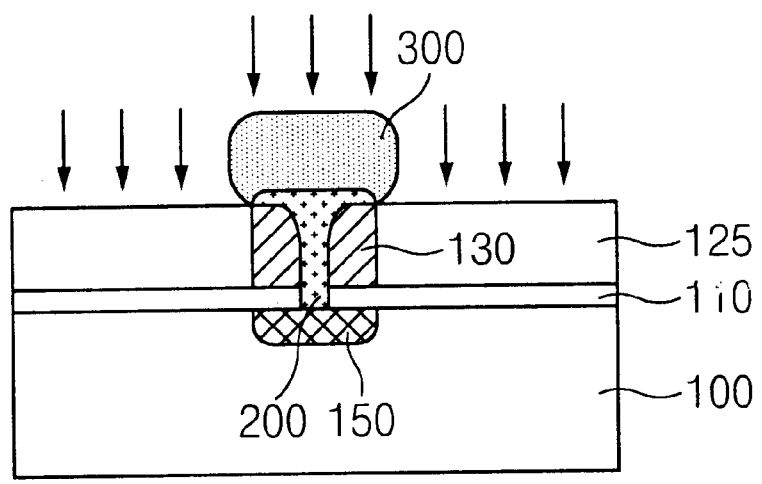
Figure 2G:
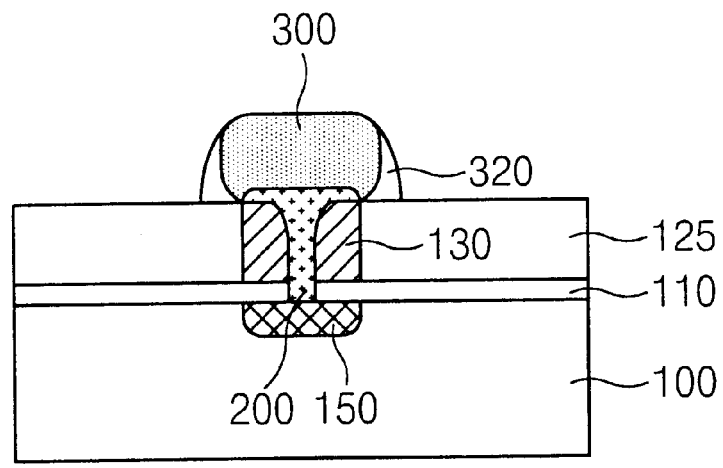
Figure 2H:
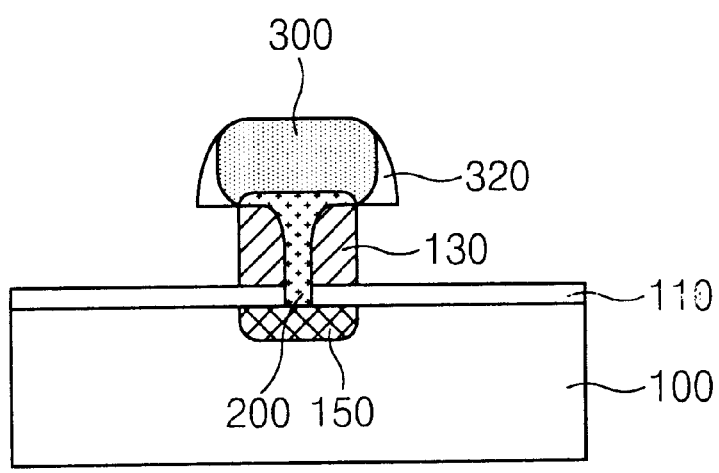
Figure 2I:
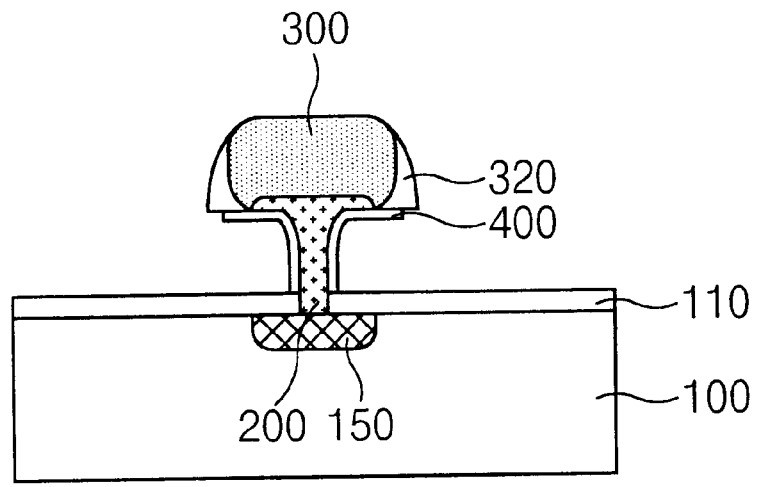
Figure 2J:
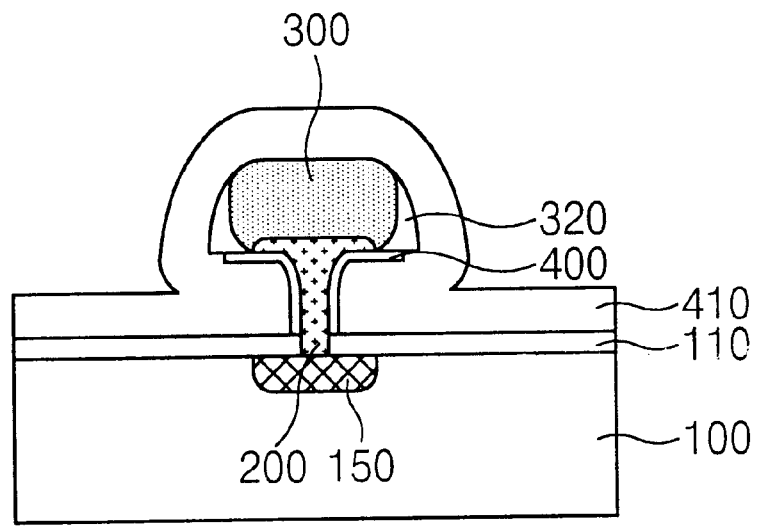
Figure 2K:
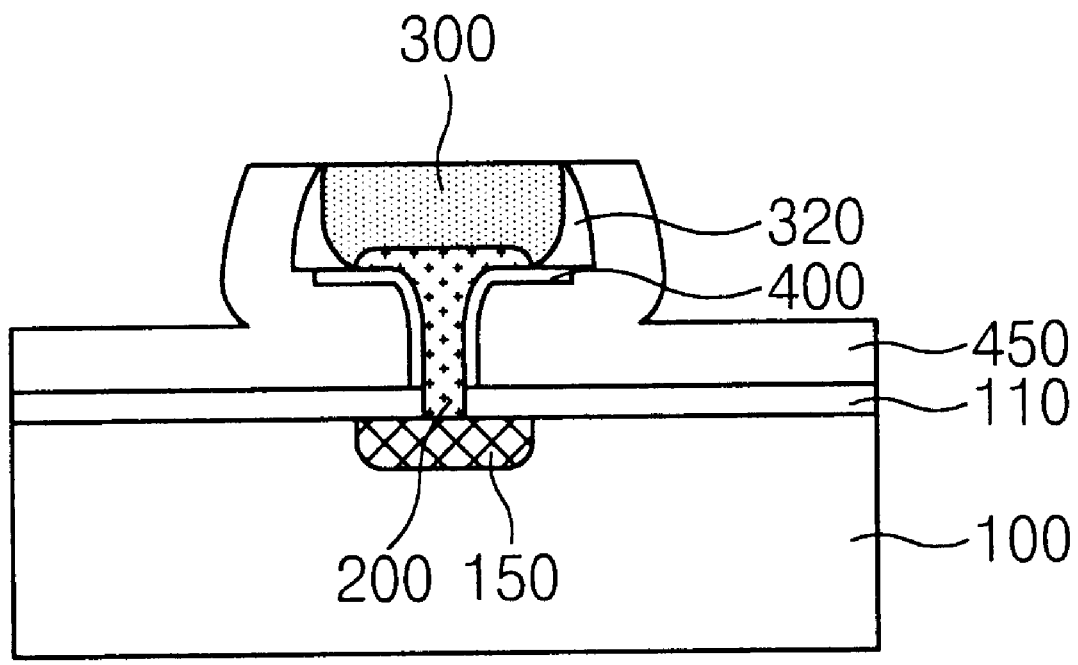

Next, a second silicon layer 300 composed of single crystal line silicon is formed on the first silicon layer 200 (see FIG. 2e). Since the second silicon layer 300 has no sidewalls such as the oxide film spacer 130, it takes a shape of a mushroom. A drain region 310 is then formed by implanting impurity ions into the second silicon layer 300. Here, it is preferable that the ions used in the ion-implantation process are the same as those used in formation process of the source region 150. After the ion implantation process, the thermal treatment process is preferably performed (see FIG. 2f).

Thereafter, nitride film spacers 320 are formed on the sidewalls of the drain region 310. The nitride film spacers 320 are formed by depositing a nitride film for spacers (not shown) on the entire surface of the resultant structure, and then etching the nitride film for spacers. Here, the thickness of the nitride film for spacer preferably ranges from several to hundreds of nanometers. The thickness is determined according to voltage to be applied to gate electrode and drain. It is preferable that the nitride (not shown) is etched via dry etching method (see FIG. 2g).

Next, the oxide film pattern 125 and the oxide film spacers 130 are etched to be removed. Here, the process of etching the oxide film pattern 125 and the oxide film spacers 130 is preferably performed via wet etching method using HF and BOE (buffered oxide etchant) (see FIG. 2h).

Next, a gate insulating film 400 is formed to cover the sidewalls of the first silicon layer 200 and the exposed under surface of the drain region 310 (see FIG. 2i) The gate insulating film 400 is formed via silicon oxidation process. Then, a polysilicon layer 410 having a predetermined thickness is formed on the entire surface of the resultant structure, and planarized to expose the top portion of the drain region 310 (see FIGS. 2j and 2k). Here, it is preferable that the process of forming the polysilicon layer 410 is performed via in-Situ doping method wherein impurities such as P, As or B of a predetermined amount are implanted simultaneously. The planarization process is performed via conventional CMP process.

As discussed earlier, the vertical transistor according to the present invention wherein source/drain regions are formed by using a self-alignment method without employing the latest photolithography, channels are formed via a SEG method and gate oxide films are formed at the both ends of channels provides more efficiency and high integration than devices having the same channel length.

What is claimed is:

1. A method of manufacturing a vertical transistor, comprising the steps of:

(a) sequentially forming a nitride film and an oxide film on a semiconductor substrate;

(b) forming an oxide film pattern by removing a predetermined portion of the oxide film to expose a portion of the nitride film;

(c) forming a source region by implanting ions into the semiconductor substrate using the oxide film pattern as mask;

(d) forming an oxide film spacer on the sidewalls of the oxide film pattern and selectively etching the nitride film using the oxide film spacer pattern as a mask to form a nitride film pattern exposing the substrate;

(e) growing impurity-containing silicon on the exposed substrate so as to extrude over the oxide film pattern to form a first silicon layer which functions as a channel;

(f) selectively growing impurity-free silicon layer on the first silicon layer to form a mushroom-shaped second silicon layer;

(g) forming a drain region by implanting ions into the second silicon layer;

(h) forming a nitride spacer on the sidewalls of the drain region;

(i) removing the oxide film pattern and the oxide film spacer;

(j) forming a gate insulating film covering the sidewalls of the first silicon layer and the exposed under surface of the drain region;

(k) forming a polysilicon layer on the entire surface of the resultant structure; and (l) planarizing the polysilicon layer to expose the top portion of the drain region.

2. The method according to claim 1, wherein the step of forming a source region further comprises a thermal treatment process after implanting process.

3. The method according to claim 1, wherein the step of forming a first silicon layer is performed by a SEG (Selective Epitaxial Growth) method.

4. The method according to claim 1, wherein the step of forming a mushroom-shaped second silicon layer is performed by a SEG method.

5. The method according to claim 1, wherein the step of forming a nitride spacer comprises forming a nitride film for spacer on the entire surface of the semiconductor substrate and etching the nitride film for spacer.

6. The method according to claim 5, wherein the step of etching the nitride film for spacer is performed by a dry etching process.

7. The method according to claim 1, wherein the step of removing the oxide film pattern and the oxide film spacer is performed by a wet etching process using HF and BOE (buffered oxide etchant).

8. The method according to claim 1, wherein the step of forming a gate insulating film is performed by a silicon oxidation process.

9. The method according to claim 1, wherein the step of forming a polysilicon layer is performed by an in-situ doping method.

* * * * *